United States Patent [19]

Zimmer

[11] Patent Number: 4,658,383
[45] Date of Patent: Apr. 14, 1987

[54] AUTOMATIC GAIN CONTROL OF DIGITIZED FULL TRACE ACOUSTIC SIGNAL IN A BOREHOLE

[75] Inventor: Mark D. Zimmer, Katy, Tex.

[73] Assignee: Halliburton Company, Duncan, Okla.

[21] Appl. No.: 768,253

[22] Filed: Aug. 22, 1985

Related U.S. Application Data

[63] Continuation of Ser. No. 410,277, Aug. 23, 1982, abandoned.

[51] Int. Cl.⁴ .......................... G01V 1/40; H03G 3/20
[52] U.S. Cl. ........................................ 367/29; 367/30; 367/31; 367/75
[58] Field of Search .............................. 367/26, 29–31, 367/65–67, 73, 27, 75; 181/102; 364/422; 330/278, 279; 358/169, 170

[56] References Cited

U.S. PATENT DOCUMENTS 4,527,148 7/1985 Kuboki et al. .................. 367/65

Primary Examiner—Nelson Moskowitz
Attorney, Agent, or Firm—W. J. Beard

[57] ABSTRACT

For use in a downhole acoustic logging system including an acoustic transmitter and spaced acoustic receiver, the preferred and illustrated embodiment incorporates a gain control for the receiver system. The automatic gain control (AGC) controls data capture without clipping or fadeout, and provides the digitized value of gain setting to be recorded to assist in data reduction whereby the digitized signal and gain of the system are obtained. The inbound signal is divided into a pressure wave, a shear wave and a fluid wave. The gain function is divided into three gain control regions indentified hereinafeter as the P, S and F regions, and the gain is stepped automatically to provide an output voltage within specified limits. Those limits are observed, thereby operating the gain controlled in the AGC in digital fashion, and the received signal is amplified in a controlled manner, thereby enabling recordal of the wave form without clipping or fadeout while capturing the gain to enable recovery of the data.

7 Claims, 4 Drawing Figures

AUTOMATIC GAIN CONTROL OF DIGITIZED FULL TRACE ACOUSTIC SIGNAL IN A BOREHOLE

This application is a continuation of Ser. No. 410,277 filed Aug. 23, 1982 and now abandoned.

BACKGROUND OF THE DISCLOSURE

The apparatus of this disclosure assists an acoustal well logging apparatus. An acoustic well logging device is normally constructed in a sonde which is lowered into a borehole. Acoustic pulses from a transmitter through well fluid surrounding the sonde and into the formations adjacent to the tool. In idealized fashion, pulses are transmitted parallel to the borehole to be received at spaced acoustic receivers in the sonde. Typically, the sonde is constructed with two receivers, one being closer to the transmitter then the second receiver. For instance, the first receiver might be ten feet from the transmitter. The second receiver might be two feet further or twelve feet from the transmitter. The signal which is transmitted is a fixed frequency tone burst. It is normally an analog signal at the receivers. The amplified output signal recorded against a time base as analyzed for location of the zero crossings of the signal occurring after the transmitted burst is received.

There is a problem in recognizing onset of the received signal. A threshold value must be determined notwithstanding background noise inherent in any analog system and taking into account the very high gain that is normally used in such a system. There is some variation in recognizing the onset of the received signal. For instance, the formations will vary in their ability to transmit signals. There is background or mechanical noise from movement of the sonde. Such noise is inevitably acoustic noise. Also, stray electrical noise from electronics located in the sonde will also impact the recognition of the onset of a signal.

In addition to the recognition of the onset of a received signal, there is also a problem in sorting out the components of the received signal. In ordinary circumstances, a received signal has a first portion which is known as the compression wave or primary wave. That is identified hereinafter as the P wave. Simplistic description of this wave sets forth a model which is primarly wave transmission with particle movement along the axis of propagation of the wave. This direction of movement is perpendicular to the direction of movement of the shear wave which is known hereinafter as the S wave. The shear wave travels slower than P wave. As a matter of general interest, the P wave travels at the rate of about 50 to 100 microseconds per foot of formation in typical formations. By contrast, the shear wave or S wave is slower, typically travelling at a rate of perhaps 80-160 microseconds per foot. The time separation between the P wave and S wave is of some assistance in breaking out the components of the received acoustic wave. There is a third wave which is the fluid or F wave. Typically, the sonde is acoustically coupled to the surrounding borehole by a fluid. There is a fluid wave which travels either in the fluid column or in the fluid which permeates the formation, and its direction of travel is approximately parallel to the borehole. The fluid wave is primarly a compression wave and has a very small component of shear particle motion. Taking into account the three waves just described, ordinarily, a receiver carried on a sonde and spaced from a transmitter on the same sonde will receive the P wave first, the S wave second and the F wave last. While there are great variations in the transmissivity of the three types of waves, it is customary to see them arrive in the sequence of P wave, S wave and F wave last. They will, however, vary markedly in relative amplitude, and will also vary in spacing from one another. For instance, the fluid wave travels typically at a relatively fixed velocity of about 190 microseconds per foot. This velocity is more or less constant. It is a result of transmission of the fluid wave through a fluid which has relatively constant transmission characteristics.

Amplification and subsequent recording of the received signals is important to proper analysis of the data. On the one hand, it is possible to overdrive the amplifier equipment and clip the signal. This results in a loss of signal quality. On the other hand, the signal has a large dynamic range, and it is possible to record the signal with too little gain and thereby lose valuable signal content due to the loss of recorded signal. A happy balance requires operation of the AGC system for the amplifier to provide a suitably amplified signal for recording.

The shape of the signal is important, but the absolute value of the signal is also important. To this end, the gain of the AGC system needs to be represented and recorded along with the signal shape. Further, this must occur dynamically along with the recording of the received signal. In other words, wave shape only will not suffice; peak amplitude is important also.

Data analysis of the recorded acoustic wave form is aided and assisted by recognizing the P, S and F wave onset. It is also helpful to recognize the onset of all three waves separate from one another so that the gain can be adjusted. This particularly prevents overdriving or clipping as will occur when amplifiers are saturated when large signals are observed at the receiver. It is possible that the onset of each of the three wave components is preceeded by a very low null signal wherein the only signal observed is the noise in the system. This null area may separate the three waves, but then again, it may not be present depending on the relative velocity of transmission.

With a view of analyzing the received signal to enable its recordal without clipping or overdriving on the one hand and at sufficient amplitude so as to obtain a fairly large wave form and data, this apparatus is an AGC system for use with an acoustic receiver amplifier in an acoustic logging system. The device is summarized as an AGC control system which observes the onset of the P, S and F wave components (if isolated) and forms signals enabling controlled switching of the attenuation system in the amplifier. So to speak, controlled attenuation is reflected in an AGC signal which can be recorded. The amplifier is switched so that the output signal is confined within certain limits. The output signal is switched from time to time to assure that the entirety of the received signal is recorded at suitable levels.

The apparatus of this disclosure has as one feature a digital gain attenuator. The measure of attenuation is stored so that the gain in the system is recorded as a part of the value of the wave form. Moreover, a pattern of switching is established for the received acoustic signal to enable the P, S and F wave peak values to be observed in the recorded data without overdriving or under amplification.

BRIEF DESCRIPTION OF THE DRAWINGS

So that the manner in which the above recited features, advantages and objects of the present invention are attained and can be understood in detail, more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
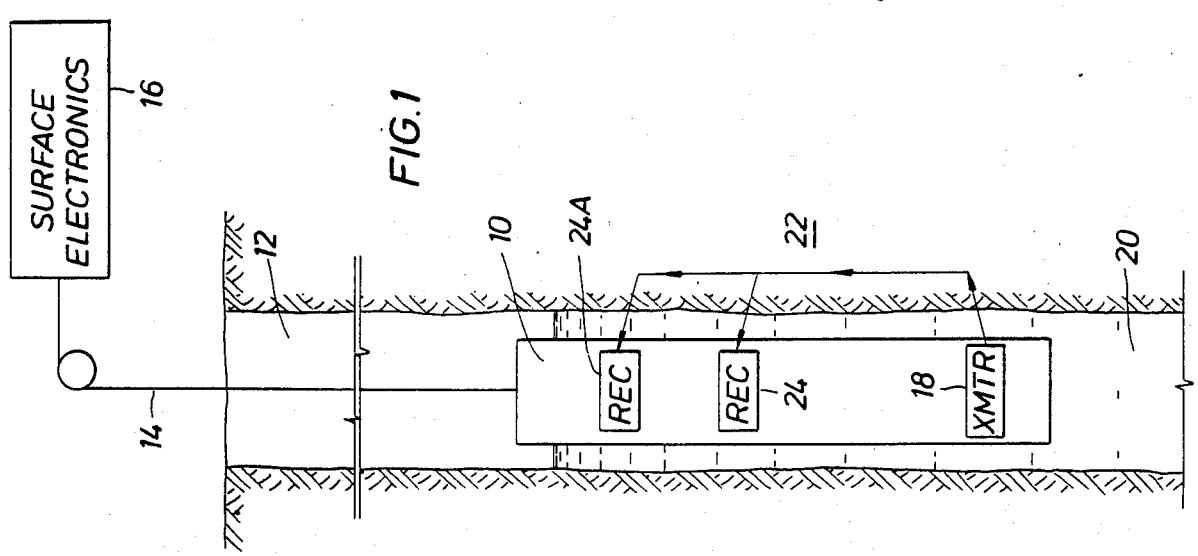
FIG. 1 illustrates an acoustic logging tool suspended in a borehole for performing acoustic logging tests as the sonde is raised in the borehole.
Figure 4:
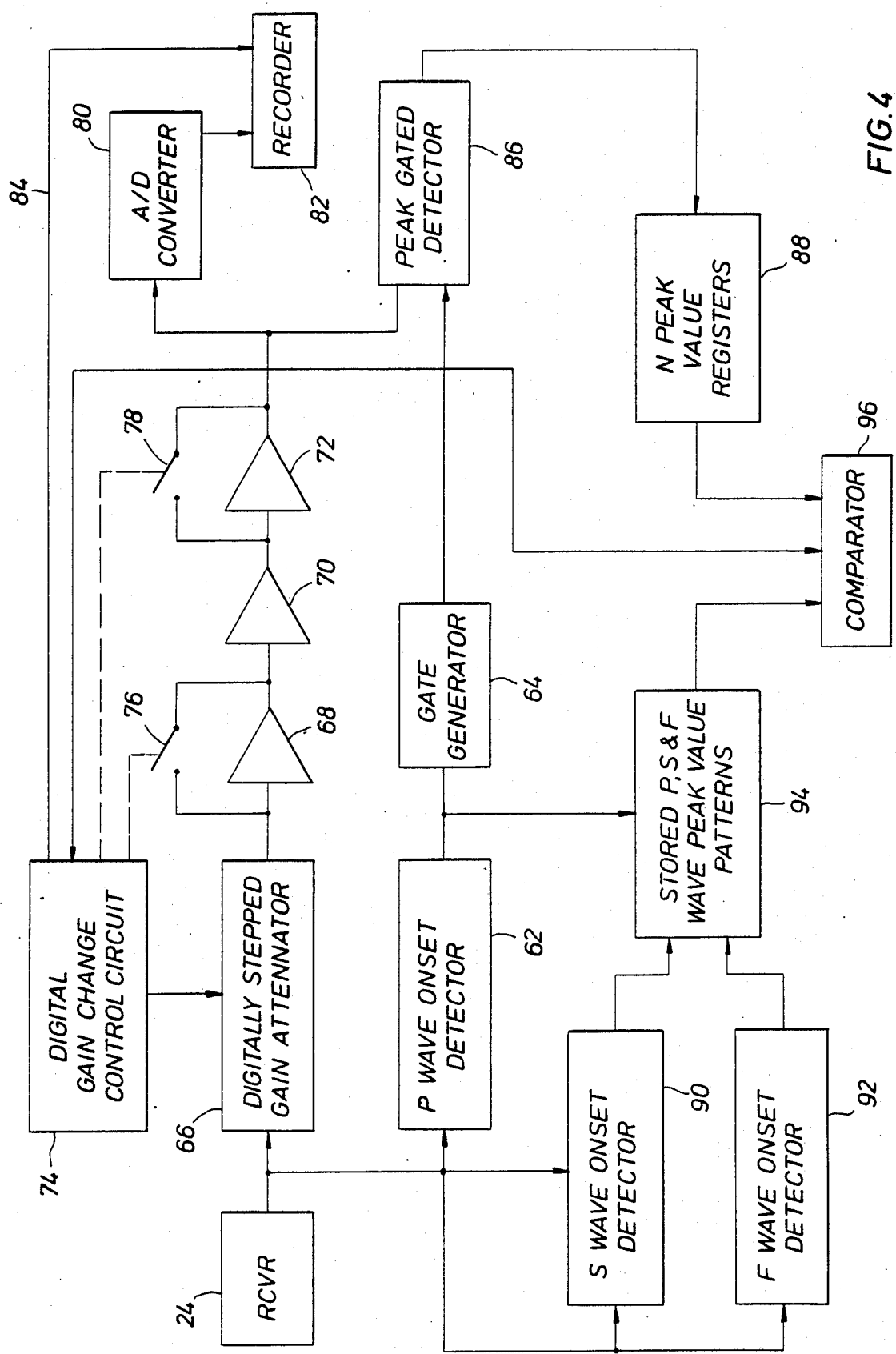
FIG. 4 is a schematic wiring diagram of apparatus for carrying out received acoustic wave recording in accordance with the present invention.

Attention is first directed to FIG. 1 of the drawings. A sonde 10 is shown there suspended in borehole 12. It is supported on an armored logging cable 14 which connects with suitable surface located electronics 16. The electronics at the surface typically includes suitable power supplies, data recording apparatus and the like. The sonde 10 is raised and lowered in the borehole on the cable 14. The sonde encloses and supports an acoustic transmitter 18. The acoustic transmitter forms an acoustic pulse in synchronized fashion which pulse is transmitted from the transmitter 18 to first and second receivers indicated by the numerals 24 and 24A. The path of travel for the acoustic energy is idealized in FIG. 1; while the actual path of travel may differ, a fairly good representation of the path of travel is shown in FIG. 1 and exemplifies how the transmitted acoustic pulse or burst is observed at the receivers 24 and 24A. The transmitter is of typical construction and the receivers are equiped with sensors and front end amplification systems for providing signals to the equipment shown in FIG. 4 as will be discussed.

Figure 2:
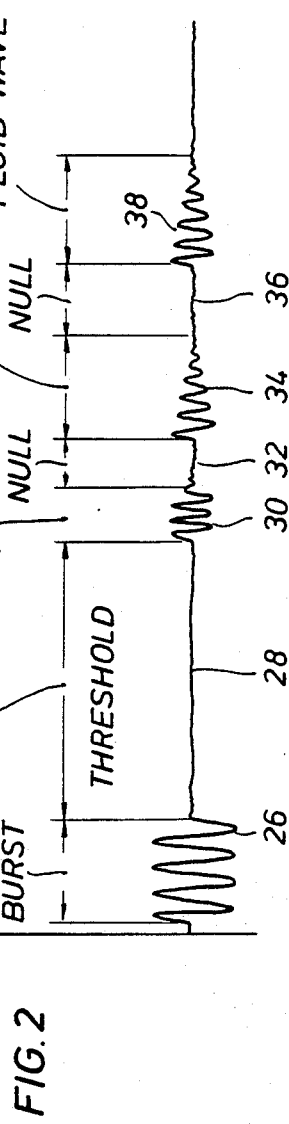
FIG. 2 is an idealized signal at the receiver time shifted from a transmitter burst to illustrate a compression wave, a shear wave and a fluid wave.

Attention is directed to FIG. 2 of the drawings. There a transmitter burst or pulse is illustrated. The transmitted pulse 26 is sustained for a few microseconds and the pulse is normally transmitted at relatively high amplitude at a fixed frequency. It is simply represented as a pure sine wave. It is will be appreciated that the frequency and power level of the transmitted pulse can be selected over a range permissable for the transmitter. The transmitter burst 26 is the first event which occurs in the timed sequence shown in FIG. 2. FIG. 2 thus begins with the transmitter burst 26 interposed on the received signal. It is incorporated to establish a reference for operation of the receiver, and the received signal is shown after the transmitted pulse. The received signal is offset from the transmitted pulse 26 by a measure of time which reflects the time lag between the transmitted pulse 26 and the received signal. A finite duration is required for the signal to travel between transmitter and receiver. In a typical instance, the transmitter and receiver are approximately 10 feet apart. A few hundred microseconds are required for the acoustic signal to travel to the receivers. The receivers operate in the same general fashion to output a signal 28. This signal output is the system noise which reflects the absence of a coherent signal at the receiver. The system noise persists for an interval dependent on the spacing of the transmitter from the receiver and also on the relative transmissivity of the medium.

Assume for purposes of illustration that the velocity of the pressure wave is between 50 and 100 microseconds per foot and hence, a spacing of 10 feet will require betwen 500 and 1,000 microseconds. The equipment is switched on and operates to a relatively high gain for the interval 28. It is seeking a threshold, namely the onset of the first signal. This first received signal is shown in FIG. 2 to be the compression wave. The compression wave signal at the receiver is identified by the numeral 30. It is much larger than the onset or threshold value established for the system. The compression wave is relatively large, although it is clearly attenuated from the output amplitude of the transmitter burst 26. Moreover, the received signal, namely the compression wave 30, bears some similarity to the transmitted pulse. That is, it has a duration which is approximately equal to the transmitted pulse 26, and has a wave shape and frequency which are approximately the same. As will be understood, there is attenuation as well as phase shift in the compression wave.

The numeral 32 identifies a null which may or may not exist between the P wave and the S wave. The null 32 has been included for descriptive purposes. The null 32 differs from the threshold interval 28. The threshold 28 represents the time required for the transmitted burst to travel toward the receiver supported on the sonde. The null 32 represents the time shift which may exist between the P wave and the S wave. The P wave 30 precedes the null 32 while the S wave 34 follows it. The shear wave or S wave 34 is slower because it involves motion perpendicular to the path of travel or propogation. It will be appreciated that the null 32, represented in FIG. 2 as a finite interval, may so short as to be nonexistent. In fact, it is possible for the S wave to partially overlap the P wave. This depends on the transmissivity variations of the formation to the compression and shear waves, those being transmitted by different phoenomena in the medium.

An additional null is shown at 36. It is the null between the shear wave and the fluid wave. The fluid wave is represented at 38. It arrives after the null 36. Again, the null 36 has been included for general purposes to set forth the context in which the device operates. The null 36 may be found in the signal; on the other hand, the transmission characteristics of the medium may be such that the null 36 disappears or is not realized.

To summarize, FIG. 2 shows three pulses 30, 34 and 38. They are spaced from one another and easily recognized in the form shown in FIG. 2. On the other hand, they may be superimposed one over the other. The apparatus of this disclosure enables separation of waves to the extent that they can be separated, and further enables the recognition of the onset of the three waves. Using typical spacing, the onset of the P wave is about 350 microseconds after the transmitter fires. The P wave begins in the range of 350–400 microseconds later and is indicated by a peak valve about a threshold. A peak is either positive or negative.

Figure 3:
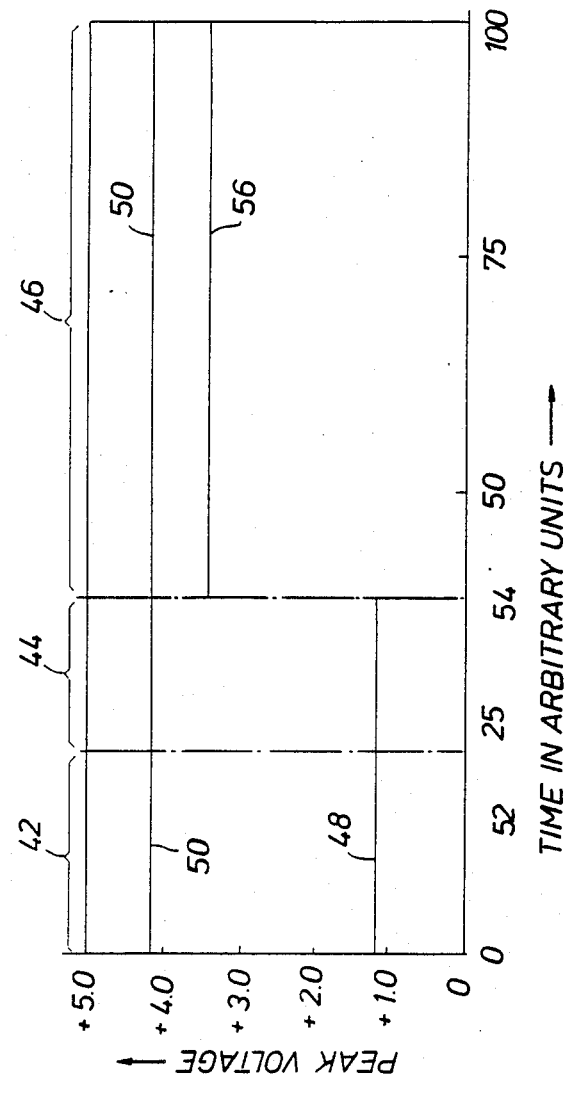
FIG. 3 is a graph of desirable peak voltages verses time in arbitrary units of a received acoustic signal which is divided into a primary wave, shear wave and fluid wave segments.

Attention is next directed to FIG. 3 of the drawings. FIG. 3 is a chart of the possible time spans which the P wave, S wave and F wave will occupy. Time starts at the onset of the first wave which is the origin of FIG. 3. The amplitude is the peak voltage output at the amplifier stage whereby 5.0 volts is the maximum voltage at which distortion or clipping begins. The amplification is the gain of the system before the signal is converted into digital form and recorded by a suitable recorder a will be described. The first portion of the interval shown in FIG. 3 is occupied by the P wave. There is a region in FIG. 3 which is identified by the numeral 42 where the P wave is expected. There is a second region which is identified by the numeral 44 where the S wave is expected. There is a third region identified by the numeral 46 where the F wave is expected. This region extends to the full duration of the receiver interval. In the P wave interval 42, it is desirable that the gain level be sufficiently high that the observed signal exceed about 1.05 volts on the scale of the equipment to be described. This level is identified by the ordinate at 48. This is an arbitrary level taking into account the scale factors of the equipment. There is a higher ordinate at 50. If the P wave amplitude is between 48 and 50 at peak values, then the peak is sufficiently large that the gain of the system is acceptable. If this occurs, it is not necessary to adjust the AGC. It is however appropriate to adjust the AGC to increase the gain if the peak value does not at least achieve the level 48. On the other hand, if peak voltages are observed above the level 50, then the gain is too high. It is then necessary to adjust the gain downwardly. For 5.0 volt maximum amplitude, it is desirable that the level 50 be approximately at 4.3 volts. This level will aid and assist in bracketing the value of the peak voltage which is observed. This bracketed value between the levels 48 and 50 is acceptable. If the gain exceeds the level 50, the gain must be reduced so that the peaks are not clipped.

The numeral 52 identifies the dividing line between the P wave interval 42 and the interval 44 for arrival of the S wave. Generally speaking, this dividing line between the two intervals can be estimated. Also, the dividing line 52 is preferably established where there is clear cut division between the P wave and S wave in the manner exemplified in FIG. 2 of the drawings. There are alternate ways of determining this. For instance, one is to determine the onset of the S wave if it is separate and does not overrun the P wave. A second way to determine the onset of the S wave is to use known values of acoustic velocity in the formation. It should be recalled that the acoustic velocity of the formation for the shear wave is approximately half that of the P wave. If the time of onset of the P wave is thus known, the time of arrival of the S wave is approximately twice that interval. Of course, these intervals are measured from a time base established by the start of transmission of the transmitted pulse. If that event is taken as the reference, the time required for the S wave to travel to the receiver is approximately twice the transmission time for the P wave.

It will be observed that the bracket levels 48 and 50 which established the desired minimum and maximum ordinates for the P wave are the same as for the S wave. The levels 48 and 50 are extended across the time intervals 42 and 44. Moreover, they represent the same approximate voltage brackets. In some formations, the maximum amplitude of the S wave is about the same as the maximum anticipated amplitude of the P wave; to this end, the same voltage amplitudes will be typically observed.

The numeral 54 identifies a second time dividing line. It is the dividing line between the intervals 44 and 46. These two intervals are divided by the line 54 which would be interposed in the null 36 shown in FIG. 2 at the onset of the fluid wave form 38. Again, FIG. 2 is neatly drawn to provide an educational example. Sometimes, the S wave does not terminate before the F wave begins and the two are superimposed over one another. In that instance, they are simply additive. Whatever the case, the time interval 54 can be started in a fairly predictable fashion. Again, it can be located by detecting the onset of the F wave in comparison with the null value. If desired, the null can be observed and the onset of the F wave signified by the excursion of the instantaneous signal. Another way to determine the time 54 is to assume that the fluid wave has a specific rate of travel or propagation. If this assumption is made, and it is reasonably predictable and accurate presumption, then the time of arrival of the fluid wave can be known, fixing the time 54. The time 54 can be estimated bacause the rate of propagation of the acoustic wave front fluid is reasonably fixed, and it typically has a maximum velocity of about 190 microseconds per foot. Since the distance between each receiver to the transmitter is a fixed parameter, the time of transmission for the transmitted pulse through the fluid is fixed; if it is fixed, the time of arrival is fairly specific at 54. The time 54 can thus be fixed either by observation or fixed as a system parameter dependent on the rate of travel of the wave.

The maximum ordinate or amplitude 50 shown in FIG. 3 is again extended through the time interval 46. It is desirable to increase the gain, and hence bracketing of the system gain is somewhat tighter in the interval 46. To this end, the maximum ordinate 50 is relatively tight compared the mimimun ordinate 56. This is shown in FIG. 3 to be approximately 3.6 volts taking into account the fact that maximum scale value is 5.0 volts without overdriving or clipping. Again, the spacing of the maximum values 50 and 56 can be varied. If the peaks of the F wave are kept between the values 50 and 56, then the system gain controlled by the AGC is acceptable.

An apparatus of carrying out the procedure described above is shown in FIG. 4. There, one of the receivers is identified by the numeral 24. Duplicate equipment is used for both receivers. The receiver 24 forms an amplified output signal. It is input to a P wave onset detector 62. This is a threshold detector which recognizes the occurance of a maximum value above the threshold. When this occurs, this triggers a gate generator 64. The gate generator forms a sequence of timed pulses. These pulses break up the interval (100 arbitrary time units in FIG. 3) so that the analog value can be digitized in a specified number of samples. For instance, it may require the formation of 100 digital values. The rate of increments in the signal wave form can be varied.

The receiver is connected to a digital stepped gain attenuator. The attenuator 66 attenuates the input signal in increments. A suitable scale value is an attenuator having a maximum rate of attenuation of 88.5 db. Preferably, it is a digitally stepped gained attenuator having about 1.5 db per step. This requires approximately 60 steps. The output of the digitally stepped gain attenuator is the amplified signal which is then applied to a series of amplifiers. They are illustrated at 68, 70 and 72.

The digitally stepped gained attenuator is controlled by a digital gain change control circuit 74. The circuit 74 inputs a control signal to change the attenuation. In addition, the circuit 74 provides a signal to a switch 76. The switch 76 shorts across the amplifier 68. The amplifier 68 can be taken out of the circuit. It has a specified gain level, and 12 db is acceptable. If it is shorted, the amplifier is simply taken out of the circuit. If the switch is open, then 12 dg gain is added. It will be appreciated that the symbol 76 is a mechanical symbol for a switch. In actuality, an electronic switch is desirable and it is controlled by a signal from the digital gain change controlled circuit 74.

In like fashion, the amplifier 72 has a switch 78 which is operated in the same fashion. Also, this switch is an electronic switch. The cascaded amplifiers form an output signal which should be within the desired limits. It is supplied to an analog to digital converter 80. That in turn forms a digital word which is input to the recorder 82 for storage. That represents the digitized value of the signal. In addition, a conductor 84 provides a setting from the digital gain change control circuit (digital format) to indicate the relative gain of the system. The gain of the system and hence, the AGC is determined by the dircuit 74 and is implemented at the attenuator 66, and the two electronic switches.

The gated peak detector 86 detects peak values in a timed interval. For instance, referring to FIG. 3, the time interval of 100 arbitrary units is divides into 100 windows, and the peak value in each window is measured. Here, peak value is important while the sign is not important. The peak value is measured in each window, and it is then output to N peak value registers 88. The values are stored. They are stored for comparison purposes as will be described.

Attention is also directed to S and F wave onset detectors 90 and 92. The F wave onset detector can simply be a timer. As described above, the F wave has a relatively consistent delay interval as it travels from transmitter to receiver. Knowing the time of transmission, it is possible to measure the time of the received signal onset. The time of received signal fixes the detector operation. It is also possible to measure the onset of the F wave. In like fashion, the S wave onset detector 90 functions in the same manner, either by detecting the onset of the wave or alternatively detecting the elapsed time interval.

The P, S and F wave onset detectors all form enable signals which are input to be stored as P, S and F wave peak value patterns. It will appreciated that FIG. 3 can be broken down into a set of patterns of anticipated signal amplitudes. In fact, this is quite easily obtained by operating the tool in a consistent manner. Specifically, a transmitted pulse is first sent and the system is operated, not knowing precisely what will be received. Thereafter, the signal is transmitted again and the values of th observed P, S and F wave peaks are stored in a storage or memory means 94. After four or five transmitted pulses, the stored values of P, S and F peaks are fairly predictable and recurrent. Then, another pulse can be transmitted and the data from this pulse is recorded at the recorder 82.

The attenuation for the digital gain change control circuit 74 must be varied over a specified pattern determined in memory at 94; this is output to a comparator 96. The actual or observed peak value from the registers 88 is stored and output to the comparator 96, and the comparator forms a driving signal for the digital gain change control circuit 74. The gain is changed up or down. The gain is changed, thereby forming a new digital word which can be stored next to the digital value of the converted data value.

From the foregoing, it will be observed that the equipment breaks up the wave form from the receiver (see FIG. 2) into a pattern in time increments more or less coinciding with that of FIG. 3. The two time lines in FIG. 3 are shifted as appropriate. This overcomes the problems which arise in the event that the data is superimposed whereby the P, S and F waves overlap. Further, the P, S and F wave peak values stored in the memory at 94 are patterns; they are the preset gains which are expected to be required at different portions in the received signal to provide adequate amplification. The peaks are therefore amplified in this manner. This time dependent gain control is implemented whereby the AGC system interposed between the receiver 24 and the analog to digital converter 80 properly sizes the signal for recording. To assure that overdriving does not occur, and to further assure that the gain control is properly adjusted, the comparator 96 follows the stored pattern.

For instance, if the time interval shown in FIG. 3 is broken into 100 samples, then 100 digital words are stored in the memory at 94. The 100 digital words represent the gain value(s) of the AGC control system. Then, when the peaks are actually observed from the peak detector 86 (gated 100 times to sychronize with the words from the memory 94), then the peak values are actually observed and input to the comparator 96. If they fall within desired values, then the gain was properly set. If the gain is not properly set, it can be adjusted dynamically. For instance, within one unit increment of time at the memory 94, five or ten individual signal peaks may occur. The gain of the AGC system was fixed while the five or ten peaks are amplified and their values are observed in the register 88. The largest peak is put into the register and stored for that time increment; if overdriving is observed, typically it will require only one step up or one step down so that the next peak in the increment has the gain slightly adjusted. This control is output from the comparator 96 to the digital gain change control circuit; that operates to form the necessary gain control signal which is also stored in the recorder.

While the foregoing is directed to the preferred embodiment, the scope of the present disclosure set forth hereinbelow.

What is claimed is:

1. An automatic gain control system apparatus for processing a received analog acoustic well logging signal and for converting such a signal into digital form comprising:
   (a) amplifier means for amplifying the received signal at a gain sufficient to provide some level of output;
   (b) means for generating at least one time gate for detection of expected peaks in the received signal;
   (c) peak detector means connected to the output of said amplifier means and responsive to said time gate generating means;
   (d) programmable automatic gain control signal generating means for forming a control signal to control the gain of said amplifier means to obtain an amplified acoustic analog signal having peak values falling within a predetermined amplitude range;
   (e) comparator means connected to the output of said peak detector means to compare received and gated peak amplitude signals with signals from said programmable automatic gain control signal generating means; and (f) means connected to said comparator means and to said programmable automatic gain control signal generating means and responsive thereto to apply control signals to said amplifier means for altering operation of said automatic gain control system on observing peak amplitude outside the specified range by said comparator means.

2. The apparatus of claim 1 including means for recognizing onset of a S wave in the analog acoustic signal, said means forming a second time gate control signal for said automatic gain control system means.

3. The apparatus of claim 1 including means for recognizing onset of a F wave in the analog acoustic signal, said means forming a third time gate control signal for said automatic gain control system means.

4. The apparatus of claims 2 or 3 wherein means for recognizing comprises means detecting onset by increase of the received acoustic signal above a specified signal amplitude.

5. The apparatus of claims 2 or 3 wherein means for recognizing onset of S waves or F waves comprises timer means timed to enable a predetermined time interval to pass after transmission of an acoustic energy pulse toward an acoustic receiver from a spaced apart acoustic transmitter.

6. The apparatus of claim 1 including means for storing a series of digital words intended as instructions for setting the gain of said amplifier means by said acoustic gain control system means; and also including means for altering the series of stored digital words as a result of observing the output of said peak detector means for amplitude peaks within specified limits.

7. The apparatus of claim 6 further including a peak value storage means for storing a series of signals representative of the peak values from received analog acoustic signals.

* * * * *